United States Patent
Ebert et al.

(10) Patent No.: US 11,880,635 B2
(45) Date of Patent: Jan. 23, 2024

(54) PLAUSIBILITY CHECKING METHOD FOR ADDITIVE MANUFACTURING METHODS

(71) Applicant: Ivoclar Vivadent AG, Schaan (LI)

(72) Inventors: Jörg Ebert, Buchs (CH); Michael Brotzge, Koblach (AT)

(73) Assignee: Ivoclar Vivadent AG, Schaan (LI)

( * ) Notice: Subject to any disclaimer, the term of this patent is extended or adjusted under 35 U.S.C. 154(b) by 0 days.

(21) Appl. No.: 17/935,669

(22) Filed: Sep. 27, 2022

(65) Prior Publication Data
US 2023/0025069 A1      Jan. 26, 2023

Related U.S. Application Data

(63) Continuation of application No. 16/814,474, filed on Mar. 10, 2020, now Pat. No. 11,507,055.

(30) Foreign Application Priority Data

Mar. 11, 2019   (EP) ..................... 19161827

(51) Int. Cl.
| | |
|---|---|
| *G06F 30/00* | (2020.01) |
| *B33Y 50/02* | (2015.01) |
| *B29C 64/393* | (2017.01) |
| *G05B 19/4099* | (2006.01) |
| *B22F 10/47* | (2021.01) |

(Continued)

(52) U.S. Cl.
CPC .............. *G06F 30/00* (2020.01); *B22F 10/30* (2021.01); *B22F 10/47* (2021.01); *B22F 10/85* (2021.01); *B29C 64/393* (2017.08); *B33Y 50/02* (2014.12); *G05B 19/4099* (2013.01); *B22F 10/12* (2021.01); *G05B 2219/35134* (2013.01);

(Continued)

(58) Field of Classification Search
CPC .... G05B 19/4099; B33Y 50/00; B33Y 50/02; B29C 64/393
USPC .......................................................... 700/119
See application file for complete search history.

(56) References Cited

U.S. PATENT DOCUMENTS

| | | |
|---|---|---|
| 6,084,980 A | 7/2000 | Nguyen et al. |
| 10,496,786 B2 | 12/2019 | Schouwenburg et al. |

(Continued)

OTHER PUBLICATIONS

Livesu, Marco et al., "From 3D models to 3D prints: an overview of the processing pipeline." Computer Graphics Forum. vol. 36, No. 2, 2017. (Year: 2017).*

(Continued)

*Primary Examiner* — Mohammad Ali
*Assistant Examiner* — Joshua T Sanders
(74) *Attorney, Agent, or Firm* — Ann M. Knab; Thad McMurray

(57) ABSTRACT

The invention relates to a plausibility checking method for rapid prototyping devices, in particular for stereolithography devices. In this connection, input data (14) is checked which is present particularly in the form of graphics data and of which every file renders a layer. Every layer comprises a plurality of pixels. The component to be printed in the respective layer is produced based on output data by the rapid prototyping device.
The input data of two consecutive layers is checked and the sum of all pixels to be exposed is determined for every layer. A signal (22) is output in particular as a warning signal (26) when the pixel sum of a following layer is larger than in the previous layer by a predetermined factor.

5 Claims, 4 Drawing Sheets

(51) Int. Cl.
*B22F 10/30* (2021.01)
*B22F 10/85* (2021.01)
*B22F 10/12* (2021.01)

(52) U.S. Cl.
CPC .............. *G05B 2219/49007* (2013.01); *G05B 2219/49023* (2013.01)

(56) References Cited

U.S. PATENT DOCUMENTS

| | | |
|---|---|---|
| 10,528,308 B2 | 1/2020 | Chen |
| 10,571,893 B2 | 2/2020 | Halperin et al. |
| 10,576,689 B2 | 3/2020 | Wighton et al. |
| 10,583,483 B2 | 3/2020 | Karlsson |
| 2010/0228369 A1* | 9/2010 | Eggers .................. G05B 15/02 700/98 |
| 2011/0178621 A1* | 7/2011 | Heide .................. B29C 64/106 700/98 |
| 2015/0269290 A1* | 9/2015 | Nelaturi .................. G06F 30/20 703/6 |
| 2018/0322621 A1* | 11/2018 | Craeghs .................. G06T 7/001 |
| 2019/0243589 A1* | 8/2019 | Chen .................. B33Y 50/02 |

OTHER PUBLICATIONS

Livesu, M., et al., Frm 3D models to 3D prints: an overview of the processing pipeline, Computer Graphics Forum, 2017, vol. 36, No. 2, pp. 537-564.

\* cited by examiner

PLAUSIBILITY CHECKING METHOD FOR ADDITIVE MANUFACTURING METHODS

CROSS-REFERENCE TO RELATED APPLICATIONS

This application is a continuation of and claims priority to U.S. application Ser. No. 16/814,474, filed on Mar. 10, 2020, which claims priority to European patent application No. 19161827.1, filed on Mar. 11, 2019, all the disclosure of which are incorporated herein by reference in their entirety.

TECHNICAL FIELD

The invention relates to a plausibility checking method.

BACKGROUND

When realizing objects to be printed such as dental restoration parts in stereolithography devices, it is required to initially provide data by means of a CAM software which data is to be fed to the stereolithography device.

The CAM software provides the data with which the stereolithography device produces the object to be printed by 3D printing.

This holds true analogously also for other additive manufacturing devices, in particular of the kind which work layer by layer. Laminated Object Modeling, Multi Jet Modeling, Selective Laser Melting, Selective Laser Sintering, Space Puzzle Molding, Stereolithography, Binder Jetting and all other 3D printing methods are to be stressed particularly.

As the construction is a three-dimensional realization of the shape and as relatively complex objects can also be designed and produced in some cases, it is required in some cases to use structures referred to as support structures. They serve to provide a connection between the zero level, i.e. the printing base, and the object.

Typically, the CAM software produces the support structures automatically.

However, it is possible in many cases to do without support structures such that the cleaning effort is reduced considerably in the later course of the procedure. For this purpose, the object is turned into the optimum virtual construction level for this purpose such that all-over contact with the zero level is provided.

While the data is prepared in the CAM software or possibly already during the CAD design, changes are often made for different reasons which lead to displacement or rotation of objects in the virtual 3D constructional space.

As a consequence, particularly in case of support structure-free constructions, contact between a large and planar exterior surface and the zero level is not or not completely provided anymore frequently.

Although such a rotation does not lead to defective or erroneous data because the data output still renders exactly the object to be printed, it may cause problems in the stereolithography printing process.

Furthermore, there is a risk that during the stereolithography process or another additive manufacturing process, for similar reasons from one slice to the next, i.e. from one layer to the next, new surfaces are created which are not supported by a support structure. Such new surfaces have no connection with the object and therefore cannot be built up by means of stereolithography.

These problems have been known for long in stereolithography as such. To counteract these problems, the CAM software predetermines partially automatically and partially semi-automatically additional support structures even if this would be superfluous in case of a construction without orientation errors.

However, support structures of this type have to be removed later, and sometimes the support structures are at positions at which a particularly good surface would be desired which impedes the applicability of stereolithography strongly.

U.S. Pat. Nos. 10,583,483, 10,576,689, US 2015269290, U.S. Pat. Nos. 10,571,893 10,496,786, and 10,528,308 are directed to additive manufacturing methods and are hereby incorporated by reference in their entirety. In U.S. Pat. No. 10,583,483, it is known that a computer program product can include a non-transitory computer-readable storage medium having computer-readable program code portions or instructions embodied therein executable by a processor to perform certain steps.

SUMMARY

In contrast, the invention is based on the task of providing a plausibility checking method for additive manufacturing devices such as rapid prototyping devices, in particular for stereolithography devices, respectively, which allows for high-quality surfaces in wider regions of the produced object than previously possible.

This task is inventively solved by the claims. Advantageous developments may be taken from the subclaims.

According to the invention, it is provided that the output data of the CAM software is used as input data for the checking process in the plausibility checking methods for rapid prototyping devices.

The input data is checked to the extent that the data of one layer is initially recorded and stored, and then the data of a consecutive layer. Then, based on this data, the sum of all pixels to be exposed is determined and compared to the sum of the pixels to be exposed of the following layers.

If the pixel sum of the following layer is larger than in the previous layer by a predetermined factor, a signal is output. The signal can be implemented as a warning signal or as an error signal. In the case of the warning signal a warning is shown, or in the case of the error signal an error case is identified and the further execution is canceled. The predetermined factor may be any factor to be selected which is larger than 1, e.g. 1.3, 1.5, 1.8, 2.5, 3 or 4.

Which factor is preferred also depends on the print material used.

A factor 2 of the pixel sum means twice as large an exposure area of the following layer compared to the previous layer. Such a strong increase may be critical and points to a defective orientation in any case.

The tilted orientation is a special case. This can lead to the fact that no pixels would have to be printed at zero level, or a very small number of pixels, such as less than 5 or less than 20. The following layer or one of the following layers then has a non-zero pixel area and is therefore larger by more than the predetermined factor.

In this case, an error signal is output in this respect, and it is intended that the user does not continue the printing process or does not start it at all, but carries out the required corrections, i.e. corrects the orientation errors for instance, by means of the CAM software.

In the case of standard objects to be printed having a large planar exterior surface, this exterior surface extends parallel to the zero level or zero plane. Then, the number of pixels changes slightly or possibly not at all or decreases from layer to layer. In this case, there is no error case and no warning signal is output.

Theoretically, the number of pixels could be reduced from one layer to the next layer and increased to the same extent at another region in this layer. However, internal tests of the inventors herein have revealed that this special case practically never occurs such that the inventive criterion surprisingly provides a good basis of decision-making to produce 3D print objects with few support structures or no support structures at all which can do without any special post-treatment of surfaces accordingly and thus have a good surface quality.

Exceptions to this only arise at most in the form of e.g. expansive or protruding jaw models or geometric structures e.g. in the form of articulation elements or base structures definable arbitrarily in the data preparation which are fused with the dental object, such as angled bases for easier removal from the construction platform or channel structures. While the increase in the exposure area in the latter cases can theoretically be supplied and considered as meta information of the data preparation, the dental case is an example of a higher factor (still<2).

To constructively cover such exceptions of this type, a special embodiment of the invention provides that the entire area is divided into sub-regions. An area is determined to be a sub-region which comprises a plurality of pixels to be exposed in a considered layer.

According to the invention, two consecutive layers are checked and the sum of all pixels to be exposed within a first sub-region of this layer is determined. A signal is output when the pixel sum, i.e. the exposure area within a second sub-region of one of the following layers differs from the number of pixels in the first sub-region of the previous layer connected with the second sub-region by a predetermined factor, is in particular larger at least by the predetermined factor.

Here, the term connected sub-regions indicates that the sub-regions to be exposed of adjacent layers comprise pixels which abut on one another, i.e. that they have at least one common pixel to be exposed, i.e. a pixel with the same x and y coordinates.

When the objects to be produced are produced with support structures, it is provided according to a further aspect of the invention that a comparison of the pixels of one layer with the pixels of the next layer is made to the effect if in the next layer a non-connected component region of pixels to be printed exists which has not been present in the previous layer. In such a case, a signal is also output, and a warning that support structures are missing.

According to a further aspect of the invention which also holds true when the objects to be produced are produced with support structures, there is a comparison of the number of pixels of one layer in the support structure with the number of pixels of the next layer in the support structure.

This comparison is repeated layer by layer, and a signal is output when the result of the comparisons indicates that there is no increase in area exceeding a predetermined extent over a predetermined number of layers.

Then, this means that the elongated, rod-shaped support structure has become too long vertically to be able to realize the desired support function without support. Branching or a grid structure of support bars becomes necessary.

The signal may indicate this as an error case.

The signal may either stop the initiation of the printing process automatically, or a warning signal is output. This warning signal may signalize acoustically or optically that a construction error is to be expected.

Additionally, it is useful to provide indications of what the user should do next, namely to correct the orientation error in the CAM software.

If it turns out in the checking of the layers that there is a new area in the region of any of the successive layers, i.e., an unconnected and newly emerging component region, or a quasi island of pixels which was not present in the previous layer, a corresponding warning signal is also output. Here, the warning message may be modified to the effect that the support structures should be checked in the CAM software.

According to the invention, it is favorable to ensure that the building job may be carried out without errors. Also, it is beneficial to provide a building job that is can reliably prevent in advance that impurities without support structures may enter the construction material. Thus, unsupported construction material pieces floating in the liquid construction material are prevented.

Additional costs due to the expected faulty construction job are avoided. The additional expenditure has up to this point has represented a considerable economic loss (loss of time: the faulty construction job must be eliminated and repeated; delays to the customer; financial loss: loss of building material and possibly consumables).

It is to be understood that according to the inventive plausibility checking method all layers, i.e. all data of the CAM software, are checked initially before approval for printing. In this respect, the building job is not started when a corresponding warning signal is output.

In an advantageous configuration, the difference between the numbers of pixels of consecutive layers is monitored, preferably continuously, and a signal is output when the difference in percentage terms in the pixel numbers is larger than a predetermined value, larger than a positive value or smaller than a negative value. When there is no error case, the output data corresponds to the input data, and the 3D printing process is carried out in a way known per se.

While two consecutive layers are inventively checked and the change between them is detected with regard to the number of pixels to be exposed, it is also possible to involve more than the previous layer for the monitoring process in a kind of history. In this way, it is possible to detect a possible case of error even more sensitively.

When the number of exposed pixels of consecutive layers increases by more than a predetermined value in percentage terms, e.g. by 2%, the signal may be output, wherein it is also possible to perform the signaling when the numbers of pixels in consecutive layers differ by the corresponding factor downwardly, that is to say when the number of pixels decreases.

In an advantageous configuration it is provided to realize the plausibility checking method inventively in a printer driver of the stereolithography device. It is to be understood that if necessary, but also instead, a separate module may be realized which performs the inventive method, and it is also possible to use a central server or a cloud for purposes of this kind.

BRIEF DESCRIPTION OF THE DRAWINGS

Further advantages, details and features may be taken from the following descriptions of an exemplary embodiment of the invention in conjunction with the drawings, in which.

DETAILED DESCRIPTION

Figure 1:
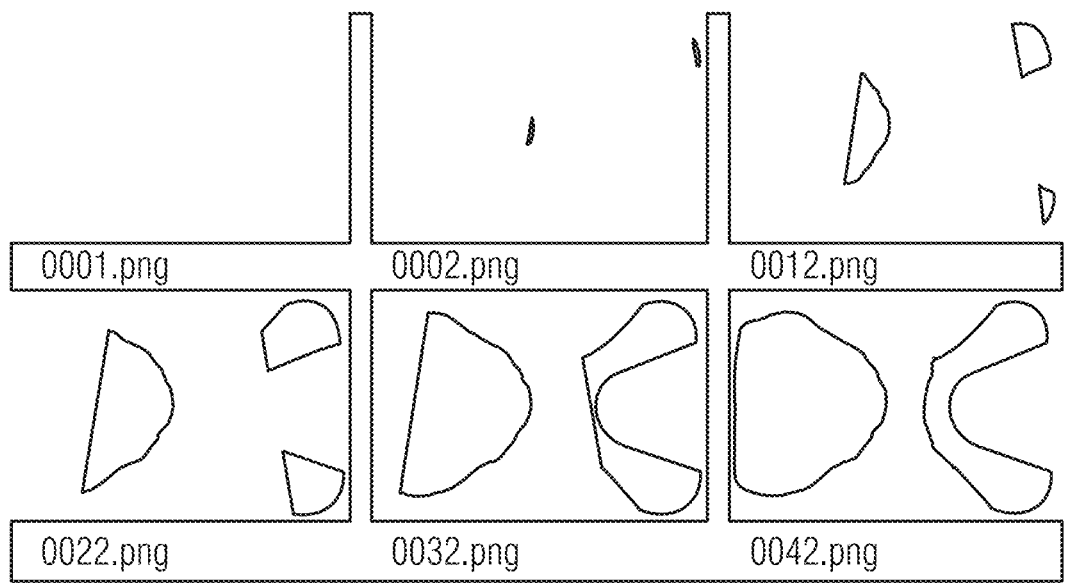
FIG. 1 shows a schematic view of the exposed pixels of the layers of an object to be produced, illustrated in different layers, namely the layers 1, 2, 12, 22, 32, 42.
Figure 3:
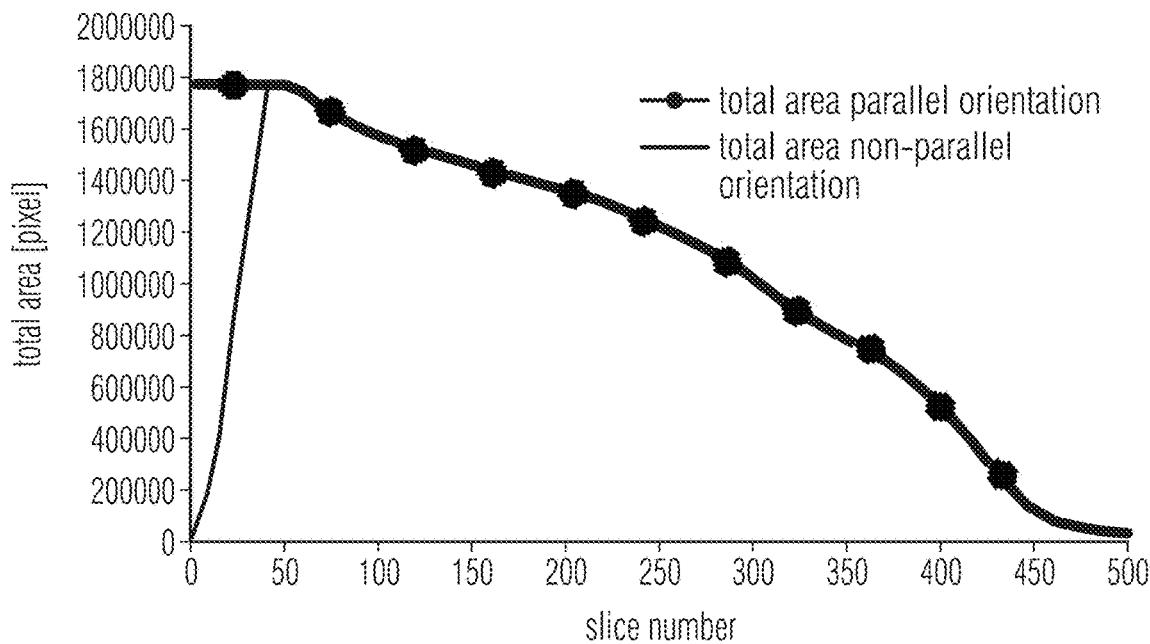
FIG. 3 shows an illustration of the number of pixels of the object according to FIG. 1 over the layers from 0 to 500, namely both with a tilted orientation and a parallel orientation.
Figure 4:
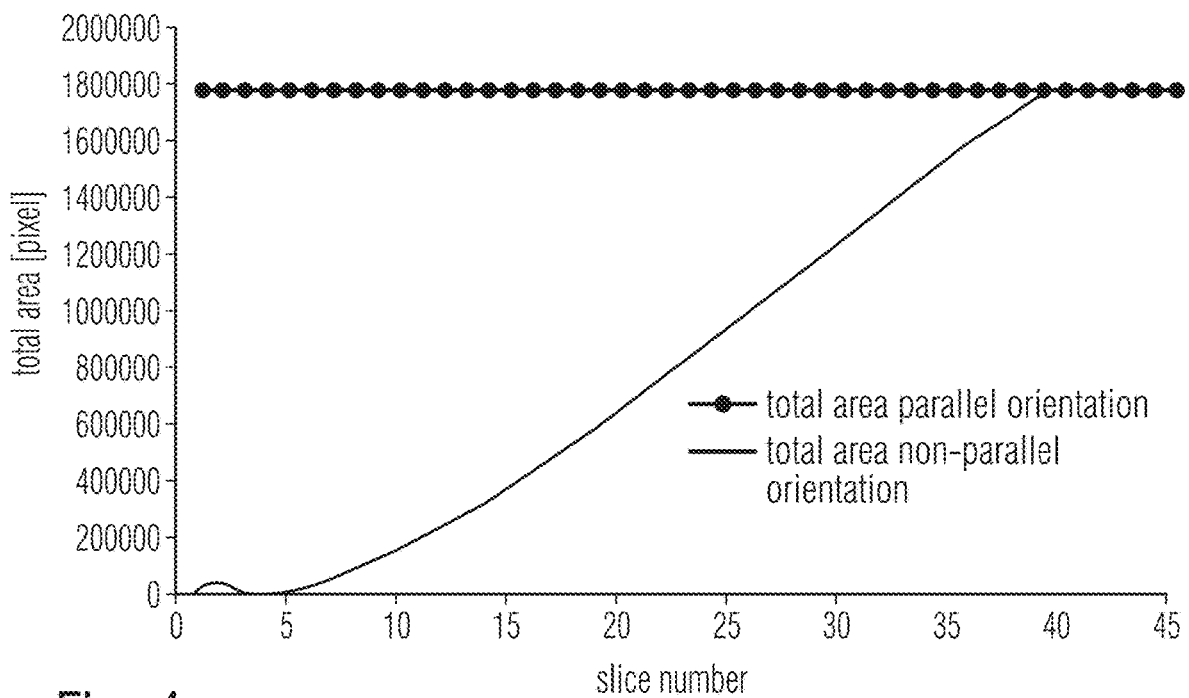
FIG. 4 shows an illustration of the first 45 layers in the diagram according to FIG. 3, in turn both with the tilted orientation and the parallel orientation.

The inventive method is described in more detail on the basis of the Figures, in particular initially of FIGS. 1, 3 and 4.

In FIG. 1, six different images of exposed pixels are illustrated corresponding to the respective layers 1, 2, 12, 22, 32 and 42. They form the graphics data and have each been produced by means of the CAM software.

According to FIG. 1, the layer 0001.png is free from exposed pixels.

This may basically also be taken from FIG. 4. There, the solid gray curve shows a small value close to zero or possibly exactly zero in layer no. 1, referred to as Slice Number 1 therein.

In FIGS. 3 and 4, the total number of the exposed pixels is plotted as "total area [pixel]" above the number of the respective layer ("slice number"). The respective curves for a correct orientation and for an incorrect orientation are plotted, in FIG. 3 the total area with parallel orientation ("total area, parallel orientation") as a thick black line and in FIG. 4 as a black line with circles, and in both FIGS. 3 and 4 the curve in case of an incorrect orientation as a gray line, referred to as "total area non-parallel orientation".

In FIG. 3, the total number of layers is plotted on the axis of abscissas, i.e. 500, while the scale in FIG. 4 is selected such that only the layers 1 to 45 are plotted.

In the exemplary case, the layer thickness of every layer is 50 μm, wherein it is to be understood that the method may be applied analogously with any layer thickness.

Even if no pixels are to be seen in "0001.png" of FIG. 1, 10 pixels are present indeed. In the consecutive layer, referred to as layer "0002.png" herein, the total number of pixels is 8726.

Now, the inventive plausibility checking method checks the ratio of the exposed pixels between consecutive layers, in this case the layers "0001.png" and "0002.png". Accordingly, the ratio is 827.6:1, calculated from the pixel numbers 8726 and 10.

In any case, it is considerably larger than a predetermined value which is set to the factor 2 herein, and a signal is output inventively which indicates a case of error. In this case, there is a construction error as the 3D object was tilted accidentally in the CAD processing such that it does not bear against the zero level or base with a planar exterior surface but only with the mentioned 10 pixels.

Now, the further check is described herein even if the inventive method already now causes the print job to be interrupted and asks the user to correct the orientation of the one or more objects in the CAM software.

If the number of pixels of the first layer is smaller than a predetermined value, e.g. 100, an additional error message may be output if necessary, e.g. also to the effect that planar contact with the zero level of the installation space is not given.

However, it is apparent from FIG. 3 and FIG. 4 that, in case of a parallel orientation, the number of pixels to be exposed in the first 45 layers is almost 1.8 million. This orientation is a buildable orientation; the CAM software has realized the parallel orientation in correspondence with the user input.

Layer 3 corresponding to "0003.png" has a pixel number of 24565. Here, in turn, the quotient would be calculated from the number of exposed pixels of the layers 3 and 2, and a value would result which amounts to approximately 3 and is larger than 2 in any case.

Here, too, an error would be indicated if the error inquiry got through to that point.

The layers 12, corresponding to "0012.png", 22, corresponding to "0022.png", 32, corresponding to "0032.png" and 42, corresponding to "0042.png" are also illustrated herein as is apparent from FIG. 1 and show that the construction area increases considerably corresponding to the number of the exposed pixels. However, the relative increase in the number of pixels per layer is below the factor 2, wherein the increase in pixels decreases increasingly strongly relatively, when viewed over 10 layers.

According to the invention, it is favorable when the relative increase in the number of pixels is checked. This is apparent from FIG. 5. The type of curves corresponds to the curves from FIGS. 3 and 4. The delta, i.e. the difference in the total area, is referred to as "delta total area", respectively, i.e. the increase or decrease in the number of exposed pixels compared to that of the previous layer.

If you consider the error case initially, it is apparent from FIG. 4 that the number of pixels differs from zero in case of layer 3 and only decreases in case of layer 4, and again differs from zero in case of layer 5.

Figure 5:
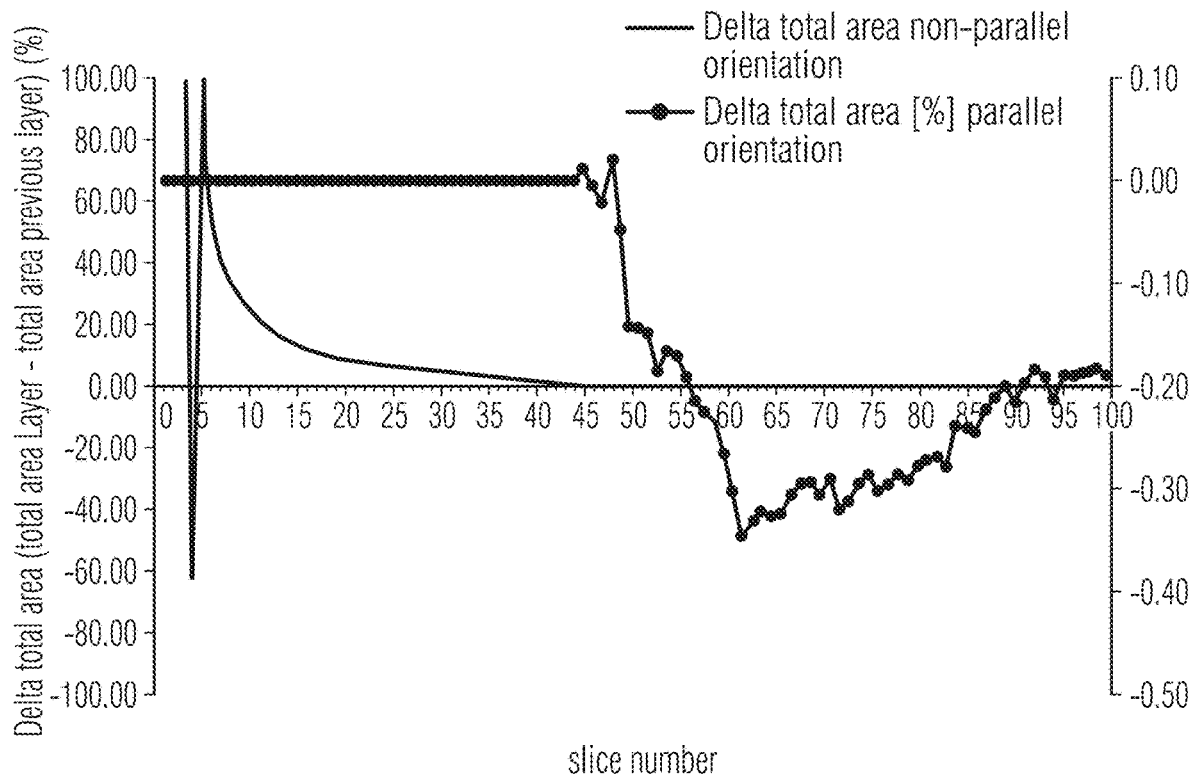
FIG. 5 shows an illustration of the increase or decrease in percentage terms of the exposure area from layer to layer, over the first 100 layers, wherein in turn the parallel orientation and the tilted orientation are illustrated.

This is expressed in the gray curve according to FIG. 5 wherein the delta is negative in case of layer 4 as there is a decrease in the number of pixels between layer 3 and layer 4.

Ultimately, the gray curve according to FIG. 5 is the differential of the gray curve from FIG. 4.

The black curve in FIG. 5 shows the deviation, i.e. the delta, of the black curve from FIG. 4 in the non-error case. The first 100 layers are plotted on a secondary axis or secondary abscissas in high resolution on the right-hand side.

As is apparent, the delta is small from layer to layer, less than +/−0.4%, i.e. it amounts to less than 0.4%.

The following table represents the delta for the layers 1 to 10 numerically; accordingly, layer 2 is assigned the value of 87160%, approximately corresponding to the factor of 872.6 according to the above description.

TABLE

Delta of the pixels available in the image relative to the number of pixels in the previous image, in percent.

| slice number = layer number | Delta total area [%], parallel orientation = Delta total area compared to previous layer, in %, parallel orientation | Delta total area [%], non-parallel orientation = Delta total area compared to previous layer, in %, tilted orientation |
|---|---|---|
| 1 | | |
| 2 | 0.00 | 87160.00 |
| 3 | 0.00 | 181.52 |
| 4 | 0.00 | −64.46 |
| 5 | 0.00 | 181.39 |
| 6 | 0.00 | 80.03 |
| 7 | 0.00 | 54.88 |
| 8 | 0.00 | 40.33 |
| 9 | 0.00 | 34.33 |
| 10 | 0.00 | 28.96 |
| 11 | 0.00 | 24.66 |
| 12 | 0.00 | 21.08 |
| 13 | 0.00 | 18.23 |
| 14 | 0.00 | 16.31 |
| 15 | 0.00 | 14.34 |
| 16 | 0.00 | 13.11 |
| 17 | 0.00 | 11.80 |
| 18 | 0.00 | 10.83 |
| 19 | 0.00 | 9.88 |
| 20 | 0.00 | 9.32 |

It is to be understood that the threshold value starting from which a signal may be output is adjustable to a large extent. The delta decreases when the layer number increases corresponding to the course of the gray curve in the FIGS. 4 and 5.

Figure 2:
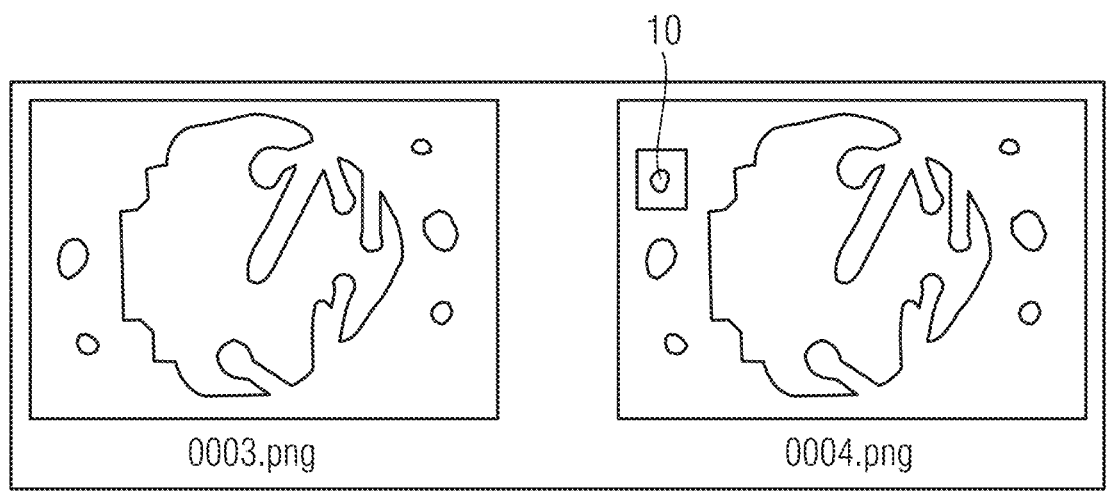
FIG. 2 shows an illustration of the exposed pixels of another object illustrating the layers 3 and 4.

It is apparent from FIG. 2 how a building job for objects with support structures is checked according to a further configuration of the invention. Here, the layers 3 and 4 corresponding to "0003.png" and "0004.png" are illustrated. Comparison of both exposure images reveals that a new component region or island 10 emerges in layer 4. However, in this exemplary embodiment the ratio of exposed pixels would not be such that an error signal according to the above check would be output. However, the non-connected component region or island 10 is realized as a new area in free space, and respective layer development would cause a new object to be created without connection to the construction platform and the rest of the object which would accordingly be able to possibly move freely in the print fluid or which would be attached to a wrong position possibly.

This error case is also covered inventively, and it is recommended to the user to insert a support structure in the CAM software for the non-connected component region 10 or else to realign the component correspondingly.

Figure 6:
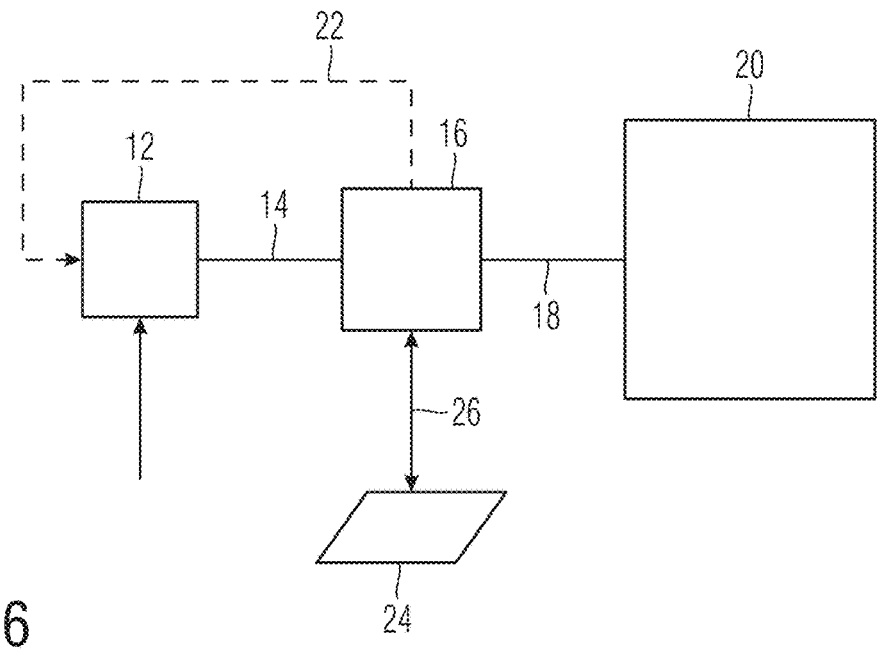
FIG. 6 shows a schematic illustration of the units for an inventive plausibility checking method.

A diagram is apparent from FIG. 6 which is to symbolize the individual steps and units for the inventive method. A CAM software module 12 produces the input data 14, which is supplied to a plausibility checking module 16, via user intervention. The plausibility checking module 16 outputs output data 18 which serves as data which is fed to the stereolithography device 20.

However, the output data 18 is only output directly if the plausibility check was successful, i.e. no signal was output. Transmission of output data is stopped until the user has noticed the warning message and has enabled further processing or follows the warning message.

The signal 22 is output when either the number of exposed pixels between consecutive layers differs by less than a predetermined value or a comparison of consecutive layers reveals that a new island 10 has emerged in the respective considered layer compared to the previous layer.

Such a comparison may be realized by means of a standard image processing algorithm.

In the exemplary embodiment illustrated, the signal 22 is fed to the CAM device, and additionally a display device 24 is activated via a warning signal 26, said display device indicating to the user not to release the building job.

Even if only a display device 24 is illustrated in FIG. 6, it is to be understood that bidirectional communication with the plausibility checking module 16 is possible herein to the effect that then the user decides how to proceed further with the building job in the plausibility checking module 16.

For instance, corresponding to the recommendation the user will then cancel and delete the building job and resort to the CAM software module 12 again to carry out the necessary corrections therein.

It is to be understood that the then corrected building job is fed to the plausibility checking module 16 again such that the plausibility check may be performed several times also cyclically until an adequate building job is provided which is fed to the stereolithography device 20 by means of the output data 18.

Figure 7:
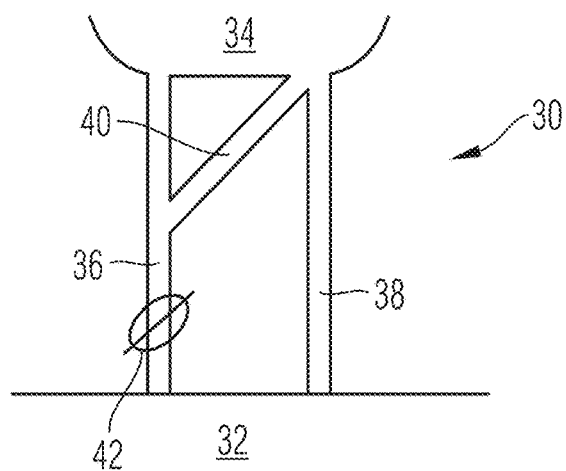
FIG. 7 shows a schematic illustration of a support structure to clarify an error case.

Exemplary support structures 30 for clarification of the invention are illustrated in FIG. 7. They extend between the base or zero level 32 and the object 34.

A first support bar 36, a second support bar 38 and a support branch 40 are illustrated exemplarily. They are provided virtually, i.e. as input data 14, for the plausibility checking module 16.

Every support structure 30 is sliced, i.e. consists of layers, in the exemplary case having a layer thickness of 50 µm.

The support bar has 36300 layers, i.e. a length of 15 mm, from the base 32 to the branch 40.

In case of the print material used, it may have this length without a crossbar being necessary, and may then offer the desired support.

The length of the bar 36 between the branch 40 and the object 34 amounts to 250 layers or 12.5 mm.

The cross-sectional area 42 or the number of pixels per layer amounts to approximately 450, with a deviation range of +/−50, for the bar, both below and above the branch. This corresponds to a diameter of approximately 1.2 mm.

For the bar 38, the pixel number per layer also amounts to between 400 and 500. However, as it is not supported laterally by a branch, the unsupported length is considerably larger than for bar 36 and amounts to 600 layers or 30 mm. This length is too large to still allow for reliable support.

According to the invention, an error signal is thus output for the bar 38. Due to the branch 40 or else due to the object 34, the number of pixels per layer changes significantly for bar 36 when viewed over 400 layers but remains within 400 to 500 for bar 38.

In this exemplary embodiment the number of consecutive layers for which no increase in area is required to prevent the signal amounts to 400. The predetermined measure of the increase in area—and thus of the increase in the number of pixels—amounts to 50%.

At the branch at layer 300 the number of pixels increases to 750 for bar 36. This is sufficient to prevent the error case and thus the signal—even if at layer 400, i.e. after the branch, the number of pixels is smaller than 500 again.

However, at layer 400 of bar 38 the number of pixels is still less than 500—i.e. across its entire length up to this point—such that the signal is triggered thereat.

It is to be understood that the indicated values are only exemplary and may be adapted to the requirements to a large extent depending on the print material.

Figure 8:
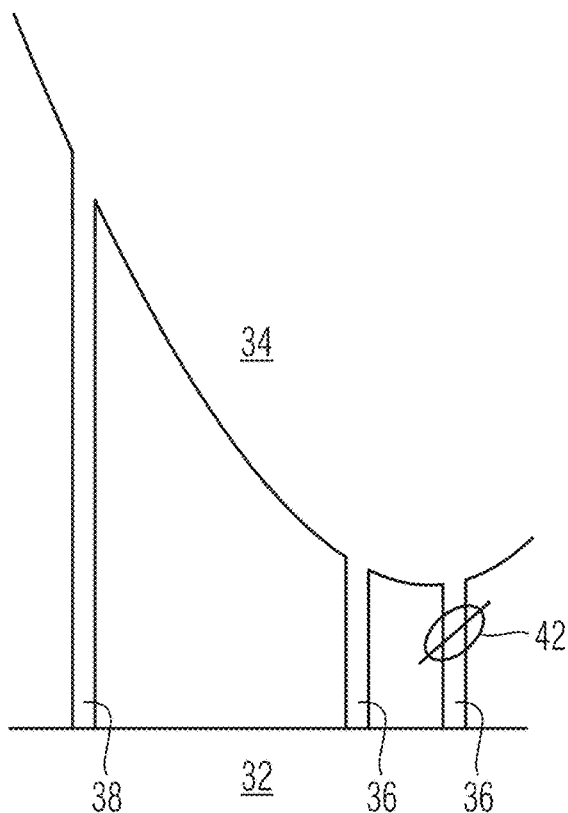
FIG. 8 shows a schematic illustration of a further embodiment of a support structure to clarify an error case.

In FIG. 8, a different support structure compared to the embodiment in FIG. 7 is illustrated. Here, the support bars 36 are considerably shorter and have a ratio of height to diameter 42 of approximately 6:1.

In case of this ratio, the bars 36 are considered to be stable such that no signal 22 is output.

However, the bar 38 has a height to diameter ratio (HDV) of approximately 25:1.

This is too much for sufficient stability especially as there is no lateral support or branch. An error signal is output.

Figure 9:
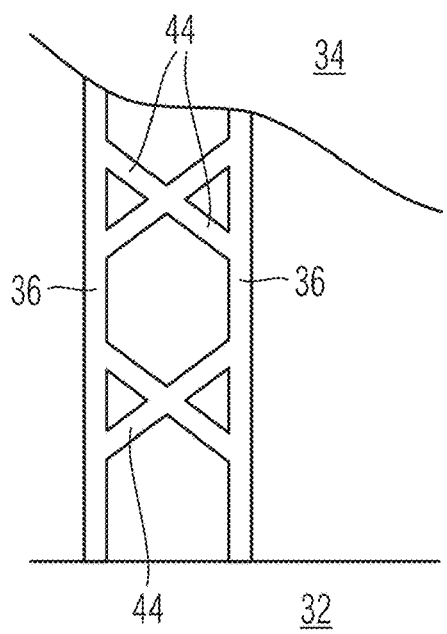
FIG. 9 shows a schematic illustration of a further embodiment of a support structure to clarify an error case.

In FIG. 9, the bars 36 have almost the same length as bar 38 from FIG. 8. They have a height to diameter ratio of approximately 20:1, which would be too much without support.

However, already in the lower third of their height they branch out into struts 44 which have a laterally supporting effect. As a result, the error case is prevented particularly as the self-supporting length of the bars 36 in FIG. 9 is only up to a HDV of approximately 5:1.

In this respect, it is crucial for error prevention if the self-supporting, i.e. branchless length of a support bar has a HDV of more than a predetermined measure, here e.g. 8:1.

This may be detected by the number of layers compared to the area of the support structure (=number of pixels).

It is to be understood that the third dimension has to be considered in fact, too, even if 2D structures are illustrated herein.

It should be further understood that the predetermined measures, values, ratios, and any other value or number discussed herein are not limited to the values set forth but may vary depending on the specific job or building structure that is being manufactured.

Functions of the printing system described hereinabove may be controlled through instructions executed by a computer-based control system. A control system suitable for use with embodiments described hereinabove may include, for example, one or more processors connected to a communication bus, one or more volatile memories 56*m* (e.g., random access memory—RAM) or non-volatile memories (e.g., Flash memory). A secondary memory (e.g., a hard disk drive, a removable storage drive, and/or removable memory chip such as an EPROM, PROM or Flash memory) may be used for storing data, computer programs or other instructions, to be loaded into the computer system.

For example, computer programs (e.g., computer control logic) may be loaded from the secondary memory into a main memory for execution by one or more processors of the control system. Alternatively or additionally, computer programs may be received via a communication interface. Such computer programs, when executed, enable the computer system to perform certain features of the present invention as discussed herein. In particular, the computer programs, when executed, enable a control processor to perform and/or cause the performance of features of the present invention. Accordingly, such computer programs may implement controllers of the computer system.

Aspects of the invention may be operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Components of a computer used herein may include, but are not limited to, a processing unit, a system memory, and a system bus that couples various system components including the system memory to the processing unit. The system bus may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The system memory may include computer storage media in the form of volatile and/or nonvolatile memory such as read only memory (ROM) and random access memory (RAM). A basic input/output system (BIOS), containing the basic routines that help to transfer information between elements within computer, such as during start-up, is typically stored in ROM. RAM typically contains data and/or program modules that are immediately accessible to and/or presently being operated on by processing unit.

The drives and their associated computer storage media may provide storage of computer readable instructions, data structures, program modules and other data for the computer. A user may enter commands and information into the computer through input devices such as a keyboard and pointing device, commonly referred to as a mouse, trackball or touch pad. Other input devices (not shown) may include a microphone, joystick, game pad, satellite dish, scanner, or the like. These and other input devices are often connected to the processing unit through a user input interface that is coupled to the system bus, but may be connected by other interface and bus structures, such as a parallel port, game port or a universal serial bus (USB). A monitor or other type of display device is also connected to the system bus via an interface, such as a video interface. In addition to the monitor, computers may also include other peripheral output devices such as speakers and printer, which may be connected through a output peripheral interface.

The computer may operate in a networked environment using logical connections to one or more remote computers, such as a remote computer. The remote computer may be a personal computer, a server, a router, a network PC, a peer device or other common network node, and typically includes many or all of the elements described above relative to the computer. The logical connections may include a local area network (LAN) and a wide area network (WAN), but may also include other networks. Such networking environments are commonplace in offices, enterprise-wide computer networks, intranets and the Internet.

The terms "program" or "software" or "algorithm" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion among different computers or processors to implement various aspects of the present invention.

An algorithm is herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

Any of the following terms such as "sending", "receiving", "transmitting", "forwarding", "caching", "causing", "providing", "generating", "adding", "subtracting", "removing", "analyzing", "determining", "enabling", "identifying", "modifying" or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

The invention claimed is:

1. A plausibility checking method for additive manufacturing devices for producing a component with support structures using input data and output data, comprising providing at least one processor configured to
    produce the input data by CAM software as graphics data of which every file renders a layer which comprises one or more pixels, which graphics data corresponds to a component region to be printed in a concerned layer,
    compare number of pixels of a layer in the support structures with number of pixels of a previous layer and previous layers in the support structure and
    output a signal when a result of the comparison reveals that across a predetermined number of layers there is no increase in the number of pixels per layer and no increase in area which exceeds a predetermined measure,
    generate the output data which controls the additive manufacturing device to produce the component to be printed, and
    wherein the component to be produced is produced with support structures.

2. The method as claimed in claim 1,
    wherein when the signal (22) is produced on a display device, a warning with regard to missing support structures is output.

3. The method as claimed in claim 2,
    wherein the display device indicates to a user not to release the output data.

4. The method as clamed in claim 1,
    wherein the support structures comprise a plurality of support bars, the support bars comprising one or more of vertical rods, lateral support bars and a grid structure.

5. A computer program product comprising program code which is stored on a non-transitory machine-readable medium, the machine-readable medium comprising computer instructions executable by a processor, which computer instructions cause the processor to perform the method as claimed in claim 1, on an additive manufacturing device.

* * * * *